(12) United States Patent
Hebb et al.

(10) Patent No.: US 6,183,127 B1
(45) Date of Patent: Feb. 6, 2001

(54) SYSTEM AND METHOD FOR THE REAL TIME DETERMINATION OF THE IN SITU EMISSIVITY OF A WORKPIECE DURING PROCESSING

(75) Inventors: Jeffrey P. Hebb, Jamaica Plain; Ali Shajii, Canton, both of MA (US)

(73) Assignee: Eaton Corporation, Beverly, MA (US)

( * ) Notice: Under 35 U.S.C. 154(b), the term of this patent shall be extended for 0 days.

(21) Appl. No.: 09/280,308

(22) Filed: Mar. 29, 1999

(51) Int. Cl.$^7$ ............................... G01N 25/00; G01J 5/00
(52) U.S. Cl. ................... 374/9; 374/1; 374/126; 374/128
(58) Field of Search ................... 374/1, 9, 126, 374/128

(56) References Cited

U.S. PATENT DOCUMENTS

| | | | |
|---|---|---|---|
| 4,120,582 | 10/1978 | De Vries et al. | 356/73 |
| 4,647,774 | 3/1987 | Brisk et al. | 250/338 |
| 4,647,775 | 3/1987 | Stein | 250/338 |
| 4,708,493 | 11/1987 | Stein | 374/128 |
| 4,880,314 | 11/1989 | Kienitz | 374/129 |
| 4,919,542 | 4/1990 | Nulman et al. | 374/9 |
| 4,956,538 | 9/1990 | Moslehi | 219/121.6 |
| 5,282,017 | 1/1994 | Kasindorf et al. | 356/446 |
| 5,305,416 * | 4/1994 | Fiory | 374/126 |
| 5,308,161 | 5/1994 | Stein | 374/5 |
| 5,310,260 | 5/1994 | Schietinger et al. | 374/142 |
| 5,318,362 | 6/1994 | Schietinger et al. | 374/142 |
| 5,326,173 * | 7/1994 | Evans et al. | 374/9 |
| 5,490,728 | 2/1996 | Schietinger et al. | 374/7 |
| 5,597,237 | 1/1997 | Stein | 374/9 |
| 5,601,366 * | 2/1997 | Paranjpe | 374/126 |
| 5,704,712 | 1/1998 | Stein | 374/126 |
| 5,727,017 * | 3/1998 | Maurer et al. | 374/9 |
| 5,823,681 * | 10/1998 | Cabib et al. | 374/128 |
| 5,993,059 * | 11/1999 | O'Neill et al. | 374/9 |
| 6,056,434 * | 5/2000 | Champetier | 374/9 |

FOREIGN PATENT DOCUMENTS

| | | | |
|---|---|---|---|
| 004315386 * | 11/1994 | (DE) | 371/1 |

OTHER PUBLICATIONS

J. F. Hebb et al., "In Situ Wafer Emissivity Measurement in a Furnace Heated RTP System," Proceedings of the 5$^{th}$ International Conference on Advanced Thermal Processing of Semiconductors, New Orleans, Louisiana, pp. 1–9 (Sep. 3–5, 1997).

* cited by examiner

*Primary Examiner*—G. Bradley Bennett
*Assistant Examiner*—Gail Verbitsky
(74) *Attorney, Agent, or Firm*—Lahive & Cockfield, LLP; Anthony A. Laurentano (57) ABSTRACT

A system and method for determining the reflectivity of a workpiece during processing in a heating chamber of a thermal processing apparatus. The system first determines directly the reflectivity of the workpiece outside of the heating chamber of the thermal processing apparatus, and then determines the reflectivity of the workpiece during processing within the heating chamber of the thermal processing apparatus by correlating the ex situ wafer reflectivity with the intensity of the radiation reflected from the wafer within the heating chamber.

55 Claims, 7 Drawing Sheets

SYSTEM AND METHOD FOR THE REAL TIME DETERMINATION OF THE IN SITU EMISSIVITY OF A WORKPIECE DURING PROCESSING

BACKGROUND OF THE INVENTION

The present invention relates to a system and method for determining a parameter of a solid object or workpiece such as a semiconductor wafer, and more particularly relates to a system and method for determining, in real time the emissivity and/or temperature of the wafer during thermal processing.

Thermal processing furnaces have been widely known and used for many years to perform a variety of semiconductor fabrication processes, including annealing, diffusion, oxidation, and chemical vapor deposition. As a result, these processes are well understood, especially with regard to the impact of process variables on the quality and uniformity of resulting products. Thermal processing furnaces typically employ either a horizontal-type furnace or a vertical-type furnace. For some applications, vertical-type furnaces are preferred because they create less particles during use, thus decreasing the incidence of contamination and wafer waste, they can be easily automated, and they require less floor space because of their relatively small footprint.

Both conventional types of furnaces are designed to heat semiconductor wafers to desired temperatures to promote either diffusion of implanted dopants to a desired depth while maintaining line width smaller than 1 micron, as known, or to perform other conventional processing techniques, such as the application of an oxide layer to the wafer or deposition of a chemical vapor layer to the wafer. The heating requirements of the wafer during processing are known and well understood, and thus are closely monitored.

Conventional vertical-type thermal processing furnaces, such as tube furnaces, are designed to support the processing tube within the furnace in the vertical position. The thermal furnace also typically employs a wafer boat assembly which is mounted to appropriate translation mechanisms for moving the wafer boat into and out of the processing tube. A wafer-handling assembly is deployed adjacent and parallel to the wafer-boat assembly to transfer the semiconductor wafers from wafer cassettes to the wafer-boat assembly. The wafers are then raised into a quartz or silicon heating tube. The tube is then slowly raised to the desired temperature and maintained at that temperature for some pre-determined period of time. Afterwards, the tube is then slowly cooled, and the wafers removed from the tube to complete the processing. A drawback of this processing technique is that it places constraints on the time-at-temperature to which a wafer can be subjected. Conventional vertical furnaces of these and other types are shown and described in U.S. Pat. No. 5,217,501 of Fuse et al. and in U.S. Pat. No. 5,387,265 of Kakizaki et al.

As the critical dimensions for silicon integrated circuits are continuously scaled downward into the sub-micron regimes requirements for within wafer temperature uniformity and wafer-to-wafer temperature repeatability become more stringent. For example, in 0.18 μm technology, the required wafer-to-wafer temperature repeatability is in the order of +/−3° C.

Pyrometry has been one method of choice for non-contact temperature measurements of a silicon wafer during processing in a thermal processing furnace, but it suffers from known drawbacks. One drawback is that the emissivity of the wafer backside must be known in order to attain accurate temperature measurements. Typically, silicon wafers have backside layers that can drastically alter the spectral emissivity of the wafer through interference effects, which can lead to temperature measurement errors during processing. Furthermore, the emissivity of the wafer is also dependent on the backside surface roughness and wafer temperature. All of these drawbacks make the determination or prediction of wafer emissivity a difficult task.

Prior art techniques have attempted to measure the wafer emissivity in situ, that is, within the furnace or heating chamber, in order to measure the temperature of the wafer during processing. One prior art method for determining wafer emissivity is to employ an AC ripple technique, as set forth, for instance, in U.S. Pat. No. 5,310,260. A light source is employed to illuminate the wafer backside within a heating chamber of the thermal processing apparatus. The radiation reflected from the wafer and the source intensity are measured, and the magnitude of the AC components of the source are extracted. The wafer emissivity is then calculated using a ripple equation. A drawback of this approach is that it occurs completely within the heating or process chamber of the thermal processing furnace, and hence it is difficult, if not impossible, to hemispherically and uniformly illuminate the wafer therein. Consequently, it is difficult to accurately determine wafer emissivity, especially in real-time, during processing.

Another drawback of prior art systems is that the heating lamps used to heat the chamber and thus the wafer are also employed to illuminate the wafer. Further, the orientation and position of the heat lamp is fixed in the system. This fixed lamp position makes it difficult to hemispherically and uniformly illuminate the wafer when disposed within the heating chamber. Moreover, the AC ripple generated by the heat lamps is used to determine wafer reflectivity. The combination of the fixed lamp position and the AC ripple often results in inaccurate wafer reflectivity measurements.

Another difficulty associated with determining wafer emissivity and hence temperature during processing is accurately determining the radiation flux within the chamber during processing. This problem arises since stray light, that is, radiation from sources other than the wafer, is reflected onto the pyrometer when measuring the radiation flux within the chamber. This measured radiation value is aggregated with the radiation emitted by the wafer, and employed to determine the wafer temperature. Since the wafer emittance is all that is desired, the pyrometer signal does not accurately measure radiation emitted just from the wafer. Conventional systems cannot accurately and completely compensate for this stray light component, and hence have difficulty achieving the temperature accuracy required by modern manufacturing techniques.

Due to the foregoing and other shortcomings of prior art thermal processing furnaces, an object of the present invention is to provide a system for accurately determining, in real time, the wafer emissivity.

Another object of the invention is to provide a system for measuring and correcting for stray light within the process chamber.

Other general and more specific objects of the invention will in part be obvious and will in part appear from the drawings and description which follow.

SUMMARY OF THE INVENTION

The present invention provides systems and methods for determining the emissivity of a wafer during processing in a heating chamber of a thermal processing apparatus. The system and method provide apparatus for determining the reflectivity of the wafer outside of the heating chamber of the thermal processing apparatus, and then determining the intensity of radiation reflected from the wafer when disposed within the heating chamber. The wafer reflectivity determined outside of the thermal processing apparatus (ex situ) is correlated with the intensity of the reflected radiation of the wafer determined within the heating chamber to determine the reflectivity of the wafer within the chamber (in situ). The system then determines the emissivity of the wafer in real time, during processing, from the in situ wafer reflectivity.

The system determines the ex situ wafer reflectivity by measuring the hemispherical directional reflectivity of the wafer prior to thermal processing the wafer within the heating chamber of the thermal processing apparatus. Specifically, the system can generally uniformly and for example hemispherically illuminate a portion of the wafer with radiation from a radiation source, and then measure the intensity of the radiation reflected from that portion of the wafer. Optionally, the system can then measure the intensity of the radiation of the radiation source, and then determine the reflectivity of the wafer from the measured radiation intensity of the wafer and the radiation source.

According to another aspect, the system can determine a ratio of the intensity of radiation reflected from the portion of the wafer and the intensity of the radiation emitted by the radiation source, generate a calibration curve correlating the reflectivity of the wafer with the ratio, and/or optionally determine the reflectivity of the wafer from the calibration curve.

According to another aspect, the system and method maintains the temperature of the wafer inside the heating chamber during the in situ reflectivity measurement at generally the same temperature of the wafer during the ex situ wafer reflectivity measurement.

According to another aspect, the system generally uniformly illuminates a portion of the wafer with an integrating sphere with radiation from a radiation source, collects the radiation reflected from the wafer, measures the intensity of the radiation reflected by the wafer and emitted by the radiation source, determines a selected mathematical relationship between the measured intensity of the reflected radiation and the radiation from the radiation source, and venerates a calibration curve correlating the reflectivity of the wafer with the mathematical relationship. The system then determines the reflectivity of the wafer from the calibration curve. The radiation emitted by the radiation source may be modulated by suitable structure, such as a chopper.

According to still another aspect, the system and method determines the intensity of reflected radiation of the wafer within the heating chamber by illuminating the wafer within the heating chamber with a radiation source, and measuring the intensity of the radiation reflected from the wafer within the chamber with a detector. The detector generates an output signal proportional to the intensity of the reflected radiation. The system then correlates the reflectivity of the wafer within the chamber with the intensity of the measured reflected radiation of the wafer within the chamber, and determines the reflectivity of the wafer within the chamber by $R=K\Delta V_W$, where R is the reflectivity of the wafer within the heating chamber, K is a constant of proportionality, and $\Delta V_W$ is the intensity of the radiation reflected from the wafer within the chamber.

According to yet another aspect, the system and method determines the constant of proportionality K by sweeping the wafer through the heating chamber of the thermal processing apparatus, and determining the constant of proportionality K from the radiation reflected from the wafer during the sweep and the reflectivity of the wafer determined outside of the heating chamber.

According to an optional aspect, the system and method then calculates the reflectivity of the wafer during processing from the constant of proportionality K, measures the intensity of the radiation reflected from the wafer during processing, and determines the real time wafer reflectivity from the measured reflected radiation and the constant of proportionality. The system then determines the emissivity of the wafer from the wafer reflectivity during processing.

According to another aspect, the system can determine the reflectivity of the wafer as a function of the intensity of the reflected radiation measured within the chamber independent of the position of the wafer within the heating chamber.

According to still another aspect, the system moves or sweeps the wafer through the heating chamber, and optionally without substantially heating the wafer during the wafer sweep, while concomitantly measuring the intensity of the radiation reflected from the wafer within the chamber at one or more wafer positions. The system stores the radiation intensity and associated wafer position during measurement. The system can also measure the radiation intensity of the radiation reflected from the wafer within the chamber at one or more wafer positions, and calculate the constant of proportionality K to facilitate the determination of the reflectivity of the wafer during processing.

According to another aspect, the system and method provides a radiation source to illuminate the wafer when disposed within the heating chamber, and detects or measures the total radiation from the wafer in the heating chamber with a detector as the wafer moves therethrough. The system can optionally correlate the measured total radiation from the wafer with radiation originating from sources other than the wafer, and determine the amount of radiation emitted from the wafer by subtracting the radiation originating from sources other than said wafer from the total measured radiation. The system can then determine the temperature of the wafer during, processing from the wafer emissivity and from the radiation emitted from the wafer.

According to another aspect, the system and method determines the reflectivity of a workpiece during processing in a heating chamber of a thermal processing apparatus, by determining directly the reflectivity of the workpiece outside of the heating chamber of the thermal processing apparatus, and determining the reflectivity of the workpiece during processing, within the heating chamber of the thermal processing apparatus.

Other general and more specific objects of the invention will in part be obvious and will in part be evident from the drawings and description which follow.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

DESCRIPTION OF ILLUSTRATED EMBODIMENTS

The present invention is directed towards a system and method for determining emissivity and temperature of a work piece, such as a semiconductor or silicon wafer, during processing. The invention provides for first determining the reflectivity of the wafer outside of a heating chamber of a thermal processing apparatus, and then determining the reflectivity of the workpiece during processing within the heating chamber of the thermal processing apparatus. The present invention achieves accurate, real time emissivity measurements in a high throughput thermal processing furnace. This invention is thus broadly adapted for determining a particular parameter of a solid object during heat processing. For purposes of clarity, the solid object will be described below as a semiconductor wafer, and the desired parameters are reflectivity, emissivity and temperature. Those of ordinary skill in the relevant art will be readily able to adapt the illustrated system for determining parameters other than those set forth above in light of the teachings herein.

Figure 1:
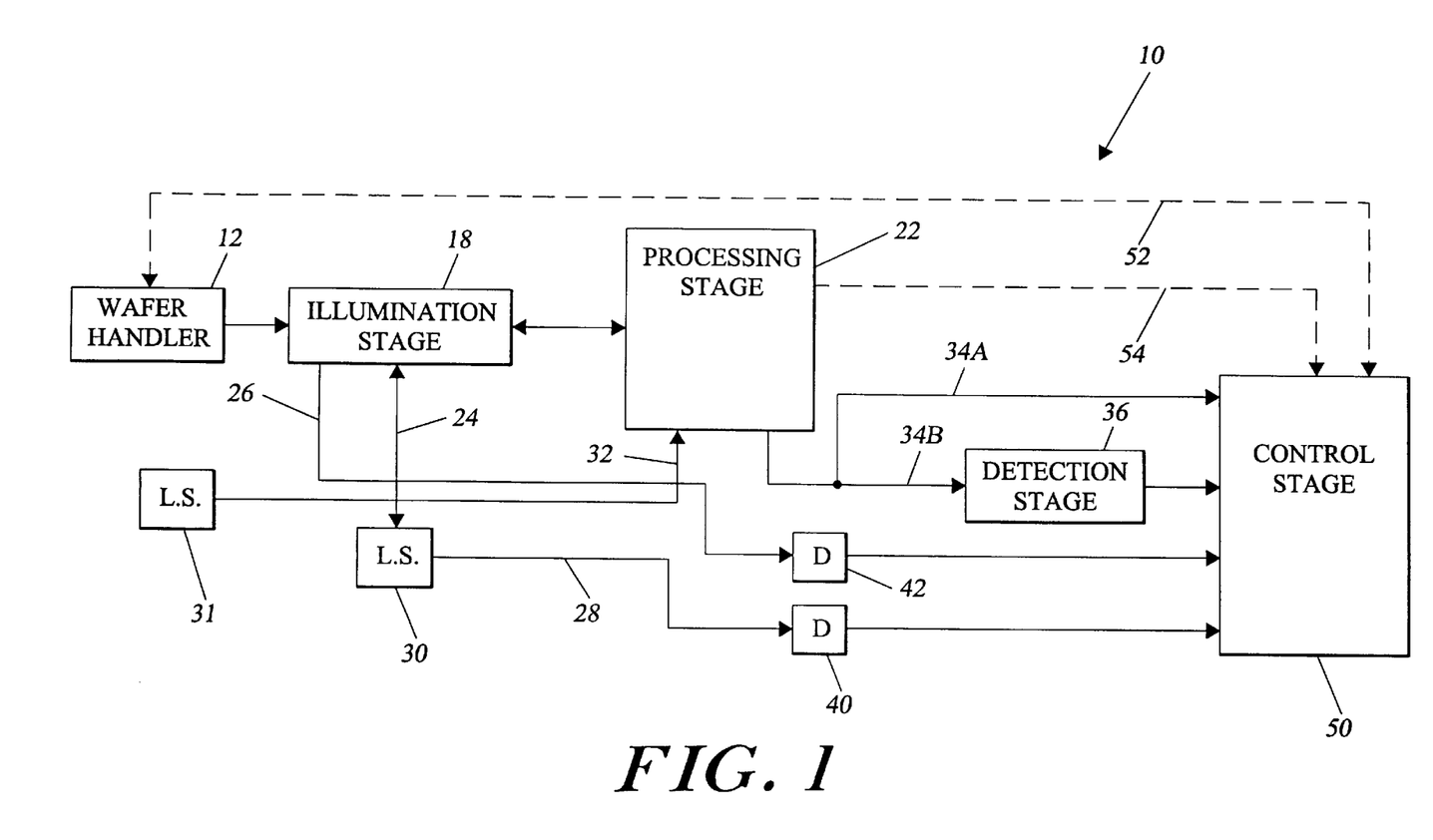
FIG. 1 is a schematic block diagram of the emissivity measuring system according to the teachings of the present invention.

FIG. 1 illustrates a temperature measurement system 10 in accord with the teachings of the present invention. The illustrated system 10 includes a wafer handler 12 that is adapted to load a wafer into and conversely remove a wafer from, the illumination stage 18, in accord with known techniques. The illumination stage 18 provides a convenient and easily operable stage for uniformly illuminating a wafer with radiation from radiation or light source 30. For purposes of clarity, the term light source will be used herein to define a source for generating radiation in any convenient and suitable wavelength, such as in the wavelength ranges described below. The light source 30 generates a light beam 24 that is introduced to the illumination stage 18. This light beam 24 is used to illuminate a portion, such as a backside portion, of the wafer. The illumination stage 18 is constructed so as to achieve a substantially uniform and hemispherical illumination of the wafer. The light source 30 as described herein generates radiation within any particular wavelength range, and preferably in the visible. infrared, and the microwave ranges. Hence, the light source 30 employed in the illustrated system 10 is intended to broadly include any suitable radiation source that is consistent with achieving accurate measurements of one or more parameters of a wafer in accord with the present invention.

The illumination reflected by the wafer within the illumination stage 18 is captured via any suitable optical pathway 26, such as by a fiber optic cable assembly, and is directed to a detector 42. The detector 42 converts the light signal into a suitable electrical signal which is coupled to a control stage 50. The light source 30 also generates a reference beam that is transferred along an optical pathway 28 to detector 40. The detector 40 in turn generates an electrical output signal which is transferred to the control stage 50. The control stage 50 performs suitable operations and processes on the received signals and on any stored data to determine the hemispherical directional reflectivity of the wafer within the illumination stage 18 from the signals received from the detectors 40 and 42.

With further reference to FIG. 1, the wafer in the illumination stage 18 is then transferred, via any suitable method such as by the wafer handler 12, to the processing stage 22. The processing stage 22 is any suitable thermal processing furnace, and in particular is a rapid thermal processing furnace suitable for achieving high wafer throughput and rapid heating of the wafers consistent with the teachings of the present invention. The processing stage 22 performs a variety of semiconductor fabrication processes upon the wafer, such as annealing, diffusion, oxidation and chemical vapor deposition techniques. During processing, the wafer is illuminated with light from light source 31, which travels along radiation or optical pathway 32. The light reflected from the wafer during processing is captured by a suitable fiber optic assembly and is conveyed along pathway 34B to a detection stage 36, and along pathway 34A directly to the control stage 50. The illustrated detection stage 36 converts the optical signal into a suitable electrical signal for further processing by the control stage 50.

The illumination of the wafer in situ or within the heating chamber is designed to determine, in conjunction with the remainder of the system, the hemispherical directional reflectivity R at any time during processing. This measured reflectivity is then employed to determine the emissivity during processing according to a known formula, which will be described in further detail below. For purposes of clarity, the term reflectivity is used herein, although reflectivity and reflectance are intended to be used interchangeably.

The illustrated control stage 50 further is in feedback communication with the wafer handler 12 via feedback connection 52 and with the processing stage 22 via feedback connection 54. Hence, the control stage 50 can control the operation of the processing stage 22 and wafer handler 12 in order to control or adjust, as desired, the illustrated system's performance.

The control stage 50 preferably includes suitable memory modules, processors, and converters, such as analog to digital converters, to facilitate receipt of analog and digital signals from the other system components, such as from the detectors 40 and 42, as well as to process the received signals to determine reflectivity, emissivity and wafer temperature.

With reference again to FIG. 1, the detection stage 36 is adapted to measure the radiation or radiative flux within the processing stage 22. The detection stage 36 receives optical signals from the processing stage 22, and outputs a signal proportional to the received optical information. The control stage 50 employs the signals received along pathway 34A and the signals received from the detection stage 36, as well as from the detectors 40 and 42, to determine the radiative flux emitted from the wafer. Hence, this portion of the illustrated system 10 can be employed to determine the amount of stray light or radiation (e.g., radiation from sources other than the wafer) that is received by the detection stage 36 and/or the detectors 40 and 42.

Figure 2:
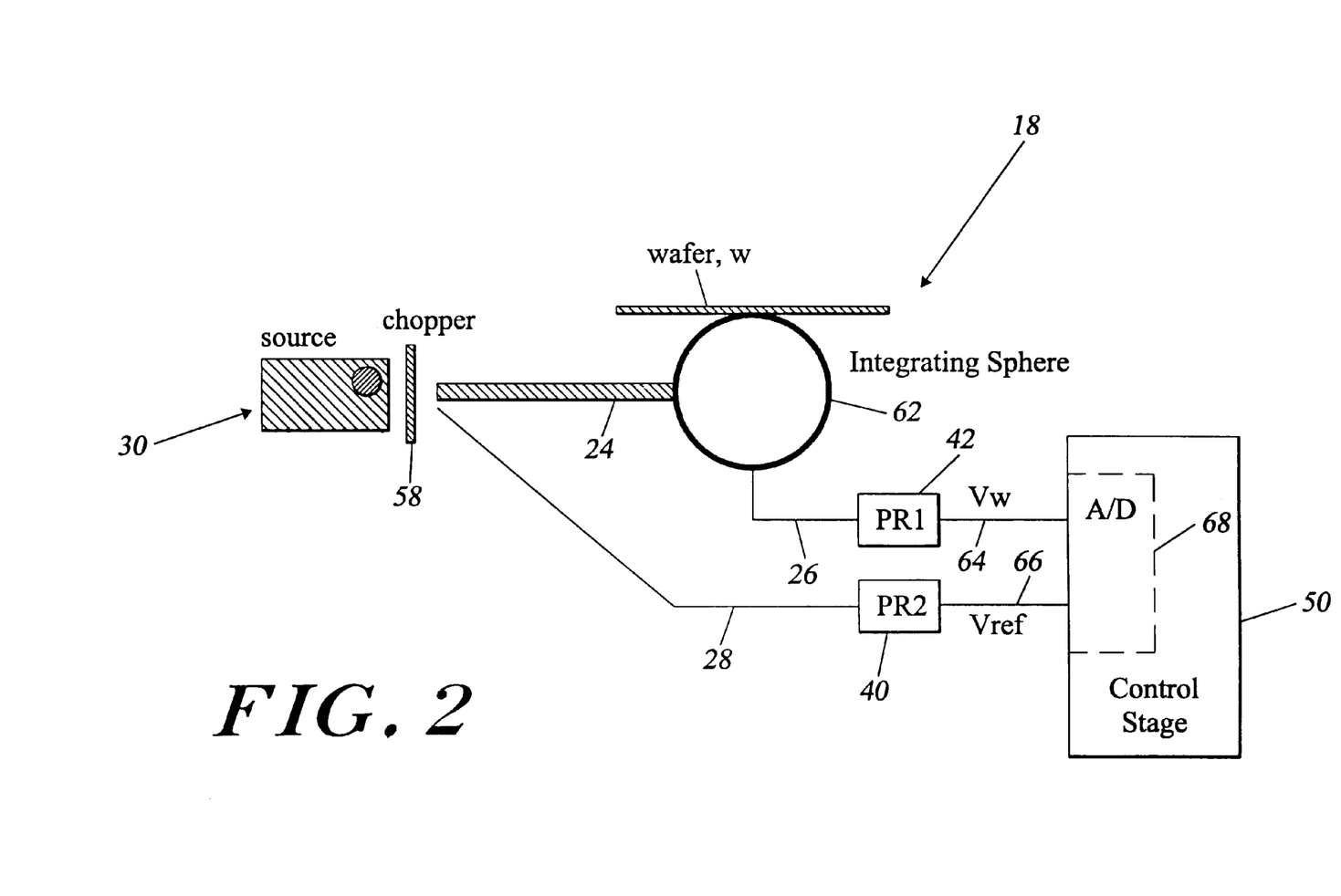
FIG. 2 is a perspective view of the ex situ radiation measurement portion of the system of FIG. 1 according to the teachings of the present invention.
Figure 3:
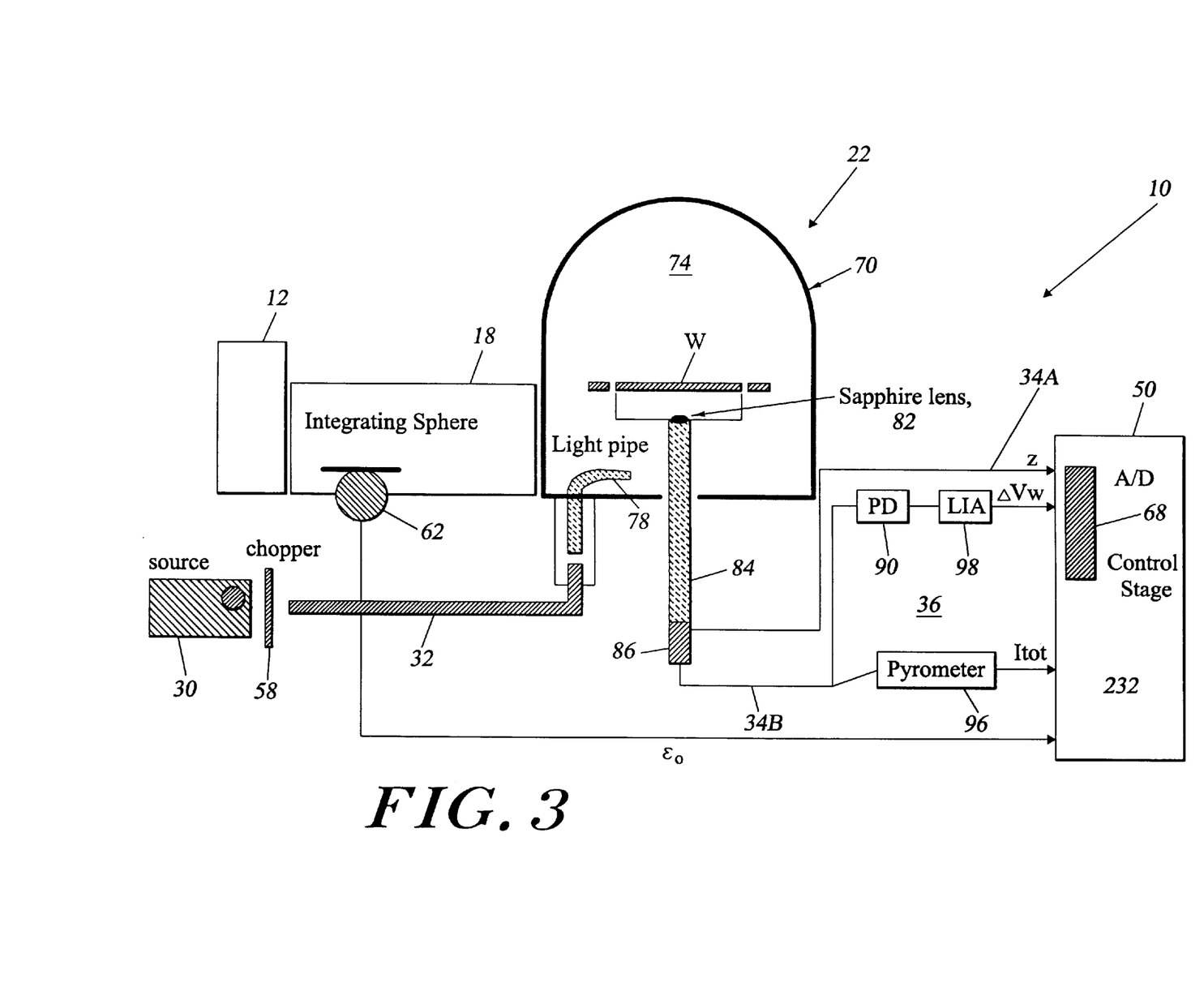
FIG. 3 is a perspective view of the in situ radiation measurement portion of the system of FIG. 1 according to the teachings of the present invention.

FIGS. 2 and 3 illustrate the components of the illustrated system 10 employed to determine the in situ emissivity of the wafer. Specifically, the figures illustrate the subsystems employed by the system 10 to first determine the wafer reflectivity ex situ of the heating chamber, and then relating or correlating the in situ reflectivity with the ex situ reflectivity. Those of ordinary skill will readily recognize that in order to accurately infer temperature from emitted flux, the wafer emissivity must be known. For semiconductor processing, the emissivity of the wafer backside is a complex function of surface finish, backside films, and wafer temperature. It is desirable in modern systems to be able to measure the real time emissivity of the wafer backside during processing, especially in a rapid thermal processing system. A goal of the illustrated system 10 is to measure the emissivity $\epsilon$ of the wafer backside during wafer processing. This is achieved by determining the spectral hemispherical directional reflectivity of the wafer backside, and applying, the following equation:

$$\epsilon(T_w) = 1 - R(T_w) \quad (1)$$

The hemispherical directional reflectivity can be measured at this stage by illuminating the wafer uniformly and hemispherically, while concomitantly collecting the reflected energy in the direction in which the emissivity is desired to be measured. Alternatively, the wafer can be illuminated in a particular direction, having a selected angle $\theta$, and collect all reflected energy over the whole hemisphere. The foregoing equation requires that the target be opaque at the pyrometer wavelength. Equation 1 is only valid if the target is opaque at the pyrometer wavelength.

The system 10 of FIGS. 1 and 2 first performs an ex situ measurement of the hemispherical directional reflectivity. Specifically, FIG. 2 illustrates the illumination system 18 for determining the reflectivity of the wafer outside of the heating chamber of the thermal processing apparatus. For purposes of clarity, we will describe the ex situ reflectivity measurement as occurring outside of the heating chamber of the thermal processing apparatus, although those of ordinary skill will readily recognize that the thermal processing apparatus can be constructed to have any selected number of additional chambers, outside of the heating chamber, in which to perform the reflectivity measurement. Practical constraints on such a system, of course, include providing a furnace of overly complex design and size, which would inhibit the placement of such a system in clean rooms of a semiconductor fabrication facility.

As shown in FIG. 2, the light source 30 generates radiation which passes through a modulator, such as an optical chopper 58, for modulating the light at a selected frequency. The light source can be a stable tungsten halogen source. The radiation that passes through the chopper 58 passes along any suitable optical pathway, such as the fiber optic cable 24, to an integrating sphere 62. The integrating sphere 62 uniformly, hemispherically and generally completely illuminates a portion of the backside of the wafer W. In the illustrated system, the integrating sphere 62 has an aperture along a selected surface disposed in registration with the cable 24 for receiving the modulated light from the light source 30 and the chopper 58. The integrating sphere 62 is highly reflective and diffuse along its inner surface and therefore reflects the radiation within the integrating sphere to uniformly and hemispherically illuminate a portion of the wafer. The illustrated wafer W seats on a selected aperture, for receiving the uniform illumination generated by the integrating sphere 62. The light reflected by the wafer is collected by a fiber optic 26 which communicates with the inner chamber of the integrating sphere 62 via a suitable aperture. During this ex situ measurement stage, the wafer W is maintained or placed at a suitable low temperature. As used herein, the phrase "low temperature" is intended to include those temperatures lower than and preferably substantially lower than the temperature at which the wafer is ultimately processed within the heating chamber of the thermal processing apparatus, and includes temperatures between about −200° C. and about 1100° C., preferably includes temperatures between about 10° C. and about 100° C., and most preferably includes disposing the wafer at approximately room temperature, such as between about 20° C. and about 30° C. The wafer is preferably processed at temperatures ranging between about 150° C. and about 1200° C.

The radiation collected by the fiber optic cable 26, which can also include any suitable optical elements to assist in collecting the reflected wafer radiation, is introduced to the photodetector 42, to yield an electrical output signal 64, designated as $V_w$. The light intensity of the source as it passes through the chopper 58 is also measured using a fiber optic cable 28 and is introduced to a second photodetector 40, to produce a suitable electrical output signal 66, designated as $V_{ref}$. The electrical signals $V_w$ and $V_{ref}$ are voltage signals which correspond to different voltages in the system. Specifically, the voltage $V_w$ is illustrative of the voltage waveform that corresponds to the radiation reflected from the wafer backside. The voltage signal $V_{ref}$ corresponds to the light generated and emitted by the light source 30. The chopper 58 is employed at this stage to produce modulated or chopped light that assists in correcting for any dc offsets or noise inherent in the photodetectors 40 and 42 or present in the system 10. Those of ordinary skill will readily recognize that any suitable photodetectors 40 and 42 can be used, such as standard photodetectors, and are preferably silicon plotodiodes manufactured by New Focus, Californai, USA. According to a preferred embodiment, the photodetectors 40 and 42 have optical columns with predetermined filters that only pass radiation in the same spectral band as the pyrometer, FIG. 3. The output voltage signals $V_w$ and $V_{ref}$ are introduced to an analog to digital (A/D) converter 68, which converts the analog voltage signals 64 and 66 to suitable digital signals. The illustrated analog to digital converter 68 can form part of the control stage 50, or can be a component separate from the control stage 50. Those of ordinary skill will readily recognize multiple arrangements of components that can be employed to effectuate the analog to digital conversion, while concomitantly employing the output information for the purposes described herein.

Those of ordinary skill will recognize that the radiation supplied to the integrating sphere 62 is modulated by the chopper 58 and then transferred to the detectors 40 and 42. The detectors typically generate an output signal corresponding to the residual background radiation in the absence of light transmitted thereto from the integrating sphere 62. This portion of the detector output signal defines a voltage minimum of the detector ouput. When radiation is introduced to the integrating sphere from the radiation source 30, the detectors generate a maxiumum output signal corresponding to both the background radiation and the radiation introduced thereto from the integrating sphere. The detectors 40 and 42 generate a maximum output voltage signal, which corresponds to both the background radiation as well as the radiation from the integrating sphere, and a minimum output voltage signal, which includes the generally only the background radiation. The difference between the maximum and minimum volatge signals corresponds generally to the light in the integrating sphere. The chopper is employed to assist in removing the background radiation which manifests as noise (e.g., the minimum voltage output signal) in the detector output signal. The wafer voltage $V_w$ in accordance with the teachings of the present invention is determined by averaging the difference of the maximum and minimum components of the detector output signal over a selected period.

The illustrated control stage 50 then determines a voltage output signal ratio of the voltage signals 64 and 66 according to the following equation:

$$\overline{V}_{w,o} = \frac{\tilde{V}_w}{\tilde{V}_{ref}} \quad (2)$$

Those of ordinary skill will readily recognize that the foregoing ratio can be determined either in hardware or in software. Prior to measuring the wafer reflectivity ex situ, a calibration curve correlating hemispherical directional reflectivity to the foregoing voltage ratio is established by measuring this ratio for a number of reference standards of known reflectivity, and fitting a best fit curve to the calibration points to develop a mathematical function of the voltages. The calibration curve is a collection of one or more sample measurements that are stored, or pre-stored, in memory in the control stage 50. The calibration curve is then employed to determine the hemispherical directional reflectivity of the wafer at the selected low temperature. Specifically, the hemispherical directional reflectivity of the wafer is determined by employing the following equation:

$$R_0 = f(\overline{V}_{w,o}) \quad (3)$$

A significant feature of the emissivity measurement system of the present invention is that it provides an illumination stage 18 that uniformly illuminates the wafer outside of the heat chamber of the thermal processing furnace. This stage affords for the easy determination of the wafer reflectivity outside of the chamber housing, prior to heat processing of the wafer. The system records this information and then correlates this information with the intensity of the radiation reflected from the wafer when disposed within the heat chamber. This is described in further detail below.

With reference to FIGS. 1 through 3, the wafer handler then passes the wafer w from the illumination stage 18 to the processing stage 22 to perform an in situ radiation measurement. The illustrated processing stage 22 can be any suitable thermal processing furnace that is adapted for the thermal processing of silicon wafers at selected temperatures. According to a preferred practice, the illustrated processing stage 29 incorporates a rapid thermal processing furnace sold under the trade names of Summit or Reliance by Eaton Thermal Processing Systems Division, USA. The Summit design system is particularly advantageous since it is a single wafer furnace that achieves high repeatability and uniform result with relatively low maintenance requirements. The thermal processing furnace develops a temperature gradient by using a 'hot wall' vertical processing chamber for single wafer processing instead of multiple lamp banks. This hot wall system is developed by employing a three zone resistance heater module at the top of the furnace (not shown), and a cooling system in the bottom of the chamber (not shown), thereby creating a temperature gradient from the top of the process chamber to the bottom. With the temperature profile of the heating chamber or furnace fixed, the desired temperature is achieved by simply adjusting the position of the wafer within the process chamber. The system temperature ramp up/down rate is controlled by the velocity with which the wafer is vertically moved through the temperature gradient within the heating chamber. Those of ordinary skill will also recognize that one or more heating or cooling stages can be provided, in addition to the furnace 22, to condition the wafer after the ex situ reflectivity measurement.

In the illustrated processing furnace 22 of FIG. 3, a silicon carbide or quartz bell jar 70 forms the process or heating chamber 74, which can be used as a constant or continuous heat source. As used herein, the word "continuous" is intended to include continuous both in temperature and heating surface area. The top of the bell jar is closed within the resistance heater module (not shown), and the bottom of the bell jar is cooled by contact with a water cooled transfer chamber (not shown). A smooth temperature gradient from top to bottom of the process chamber 74 is formed, with the top of the bell jar substantially approaching a black body radiator. The rapid temperature ramping action is achieved by moving a wafer vertically within the chamber via any suitable wafer elevator and by rapidly elevating the wafer from the transfer chamber to a position corresponding to the desired processing temperature within the process chamber 74. The wafer is cooled as it is vertically lowered within the process chamber back to the water cooled transfer chamber. The selected rates for elevating and lowering the wafer within the process chamber determine the heating and cooling rates of the wafer.

As set forth below, a pyrometer 96 is employed to measure the wafer temperature. In order to rapidly heat a wafer, it is necessary to employ a heat source having a source temperature higher than the intended wafer temperature. In the present design, the heated bell jar is maintained at a temperature of approximately 200° C. above the ultimate desired processing temperature of the wafer. The relatively large area of the heat source enables it to heat rapidly the silicon wafer during processing. In the preferred embodiment, the steady state condition of the heat source and the smaller temperature difference between the source and the work piece contribute to achieving uniform process results while concomitantly avoiding slip line generation.

With reference to FIG. 3, the wafer W is disposed within the heat chamber 74 of the thermal processing apparatus 22. A light pipe 78 is employed to illuminate the backside of the wafer W with radiation generated by the radiation or light source 31 and carried by the optical cable 32. More specifically, the light source 31 and the modulator 58 are used to illuminate a fiber optic bundle 32 with radiation chopped at a selected frequency f, which is preferably different than that of the light source 30. Those of ordinary skill will recognize that a single light source can be used in place of the two light sources 30 and 31 provided the radiation outputted therefrom is chopped at different frequencies depending upon its use. The light pipe 78 directs the radiation into the process chamber and upwardly towards the wafer backside. The total radiation or radiative flux reflected from the backside of the wafer is collected using an optical assembly that communicates with the process chamber 74 of the bell jar 70. The optical assembly includes a lens 82, such as a sapphire lens, disposed within the process chamber 74, such as at the top of the elevator tube 84, and a quartz lens 86 disposed at a bottom of the elevator tube 84.

The tube and lens assembly collects and focuses the radiation reflected off of the wafer W and received by the fiber optic cable 34B. The elevator tube 84 and associated structures serve to move or sweep the wafer vertically through the process chamber 74. The light pipe 78 illuminates the wafer when resident within the process chamber 74 by directing radiation onto the backside of the wafer. However, in the process chamber environment, with the associated elevator tube assembly and other apparatus, the light pipe 78 is unable to uniformly, completely and hemispherically illuminate the wafer backside.

Figure 7A:
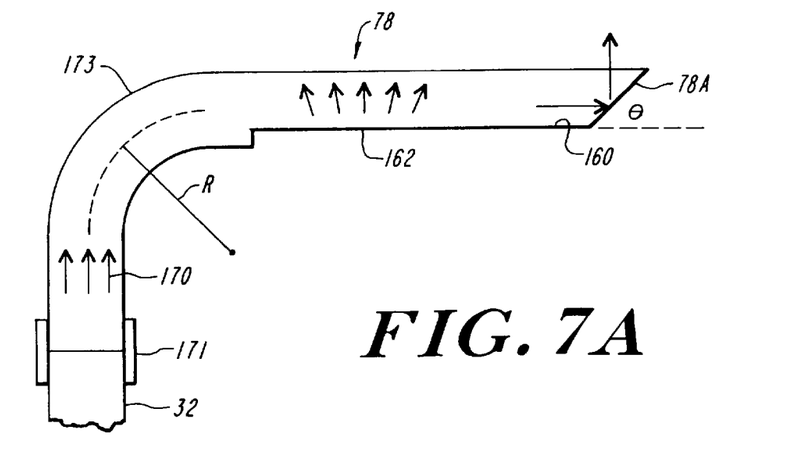
FIGS. 7A and 7B illustrate a light pipe suitable for directing radiation generated by a radiation source into the heating chamber of the system of FIG. 1.
Figure 7B:
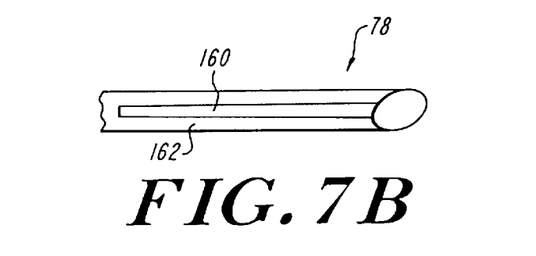

FIGS. 7A and 7B illustrate the construction of the light pipe 78 of FIG. 3 in accordance with the teachings of the present invention. The light pipe 78 is a solid quartz pipe which is coupled to one end of the fiber optic cable 32. The distal end of the light pipe has a chamfered end 78A that is cut at a selected angle θ. According to a preferred practice, θ is equal to about 45°. The light pipe 78 is attached to the fiber optic cable 32 by a suitable fastener 171. The light pipe 78 has a flat surface portion 160 formed along a bottom surface 162 to form an optically rough surface adapted to scatter radiation rays 170 travelling through the light pipe and which impinge thereon in an upwardly direction. A bottom view of the flat surface portion 160 is illustrated in FIG. 7B. In particular, the bottom surface 162 clearly illustrates the flat surface formed on the light pipe 78 and which is configured to scatter light upwardly during use.

The illustrated light pipe is preferably bent at a selected portion 173, and has a selected radius of curvature R. Those of ordinary skill will readily recognize that the radius of curvature can be selected in relation to the diameter D of the light pipe so as to minimize the amount of light loss at the bent portion of the light pipe. A typical geoemtric relationship can include forming the radius to be approximately four times greater than the diameter of the lught pipe, and can be mathematically represented as R=4 D.

In operation, the radiation rays 170 generated by the light source 31 travel through the light pipe 78, past the bent portion 1773, and to the distal end. A selected portion 162 of the light rays 170 which impinge upon the flat or optically rough surface 163 are scattered upwardly through the light pipe. Another portion of the light rays 170 which are not scattered by the optically rough surface impinge upon the chamfered end 78A of the pipe 78, and are reflected upwardly through the light pipe.

The total radiation collected by the optical assembly comprises radiation emitted from the wafer, radiation emitted from the bell jar which has reflected from the wafer, and radiation introduced into the process chamber 74 through the light pipe 78 from the light source 31. The illustrated cable 34B is a bifurcated fiber optic cable that transfers a portion of the optical information travelling along cable 34B to a photodetector 90, and the remainder of the optical information to a pyrometer 96. The photodetector 90 and the pyrometer 96 preferably include the same optical column, and include the same optical filter as the photodetectors 40 and 42 of FIG. 2. The use of the pyrometer 96 as a detector in the illustrated system achieves the advantages of performing a non-contact measurement, with relatively fast response and large temperature range. However, pyrometers are known to be dependent upon the emissivity and transmission of the wafer W, as well as exhibiting a lack of sensitivity at low temperatures. The illustrated pyrometer 96 preferably operates in a spectral band centered at about 0.95 μm, since the silicon wafer is non-transmissive or opaque at this wavelength. An advantage of operating the pyrometer in this wavelength range is that no spurious radiation from the bell jar passes through the wafer and hence impinges on the pyrometer. Another advantage is that Equation 1 is relaible when the wafer is opaque at the operating) wavelengths.

The illustrated photodetector 90 receives a portion of the optical information traveling along cable 34B, and generates an output time varying voltage signal proportional to the intensity of the radiative flux received by the optical assembly and reflected by the wafer. The photodetector 90 outputs a voltage signal proportional to the total radiative flux from the wafer including emitted radiation, stray radiation, and modulated radiation. The output signal is received by a lock-in amplifier 98, which filters any voltage signal that does not include the chopper frequency. The lock-in amplifier 98 in turn outputs the signal $\Delta V_w$ which is proportional to the intensity of the modulated radiation reflected from the wafer. This voltage output signal is received by the converter 68 of the control stage 50.

With further reference to FIG. 3, a portion of the optical information traveling along pathway 34B is transferred to the pyrometer 96, which in turn transforms the information into a digital output photodiode current signal $I_{tot}$, which is then communicated to the control stage 50 via any suitable communication pathway, such as by an RS232 serial link. The system information corresponding to the elevator position z is transferred along cable 34A directly to the converter 68. It is important to note that the intensity and angular distribution of the radiation which impinges upon the wafer backside changes or varies with the vertical wafer position within the process chamber 74. Hence, the pyrometer outputs a different signal for each vertical position. Moreover, since the wafer is supported within the furnace, it is generally difficult to mount an optical assembly that can uniformly illuminate the wafer within the chamber. Hence, the radiation measurement performed within the chamber 74 does not satisfy the generally hemispherical and uniform illumination characteristics necessary in order to properly determine the wafer reflectivity and hence emissivity.

The illustrated system 10, which includes the in situ illumination technique described above, is unable to meet the uniform and hemispherical illumination requirements in order to accurately determine reflectance and thus emissivity of the wafer. Hence, the system does not determine directly the reflectivity of the wafer within the chamber 74 from the in situ radiation measurement. Rather, the illustrated system 10 determines the hemispherical directional reflectivity of the wafer at any time during the process by assuming that the in situ reflectivity R is proportional to $\Delta V_w$ according to the following equation:

$$R = K \Delta V_w \quad (4)$$

The control stage 50 therefore correlates the in situ reflectivity R to the wafer radiative flux $\Delta V_w$ by a constant of proportionality K.

The illustrated emissivity measuring system 10 determines the constant of proportionality K, and hence the reflectivity of the wafer, by placing the wafer within the process chamber 74. The wafer W is at generally the same low temperature as when resident within the illumination system 18 when determining the ex situ hemispherical directional reflectivity. According to a preferred practice, the wafer is at room temperature during the ex situ measurement process, and is also at room temperature when placed within the process chamber 74. Due to the finite thermal mass of the wafer, it takes a finite amount of time for the thermal processing apparatus to heat the wafer. The illustrated system 10 then vertically moves or "sweeps" the wafer through the process chamber in a rapid manner, while concomitantly measuring and recording $\Delta V_w$, $I_{tot}$ and the vertical position Z, in real time, during the sweep. The system 10 then creates a table of voltage values and vertical position. According to one practice, during the sweep, the system 10 does not significantly heat the wafer, and hence the wafer is generally disposed at the same temperature when resident within the illumination stage 18. According to one practice, the wafer is only nominally heated during the sweep, and is preferably heated in a range between 30° C. and 150° C. Those of ordinary skill will recognize, however, that the wafer temperature can be raised or lowered after the ex situ hemispherical directional reflectivity of the wafer is determined, and prior to introducing the wafer into the process chamber 74. Further, the system can be operated so as to heat the wafer when disposed in the chamber 74. Since the wafer temperature does not deviate significantly from room temperature during the sweep, we know that the ex situ wafer reflectivity can be equated with the in situ wafer reflectivity R, such that $R=R_0$, where $R_0$ is the hemispherical directional reflectivity measured using the integrating sphere 62. The constant of proportionality K is determined using the following equation:

$$K(Z) = \frac{R_0}{\Delta V_{w,o}(Z)} \quad (5)$$

Once the constant of proportionality K is determined the illustrated system 10 is then able to determine the wafer reflectivity throughout the rest of the process. Hence, the illustrated system correlates the hemispherical directional reflectivity measured in the illumination stage 18 with the reflectivity measured it situ or within the process chamber 74 in accordance with Equations 4 and 5. Specifically, the hemispherical directional reflectivity and hence the emissivity of the wafer can be determined at any time during processing by the following equation:

$$\varepsilon(T_w) = 1 - \frac{R_0}{\Delta V_{w,o}(Z)} \Delta V_w \quad (6)$$

The underlying assumption is that the hemispherical directional reflectivity is linearly proportional to $\Delta V_w$. Since the constant of proportionality K is determined during the wafer sweep, it can be used throughout the process to determine wafer reflectivity. A significant advantage of the present invention is that the system 10 allows for the determination of hemispherical directional reflectivity within the chamber 74 without satisfying the conditions of uniform hemispherical illumination for in situ reflectivity measurements.

The illustrated system 50 can then determine the wafer temperature $T_w$ by processing in the control stage 50 taking the pyrometer output signal $I_{tot}$, correcting for stray or reflected light as described in further detail below, and combining it with the measured wafer emissivity to determine or infer wafer temperature. Those of ordinary skill will readily recognize that the method for determining wafer temperature from pyrometer output signals and emissivity is known in the art.

Figure 4:
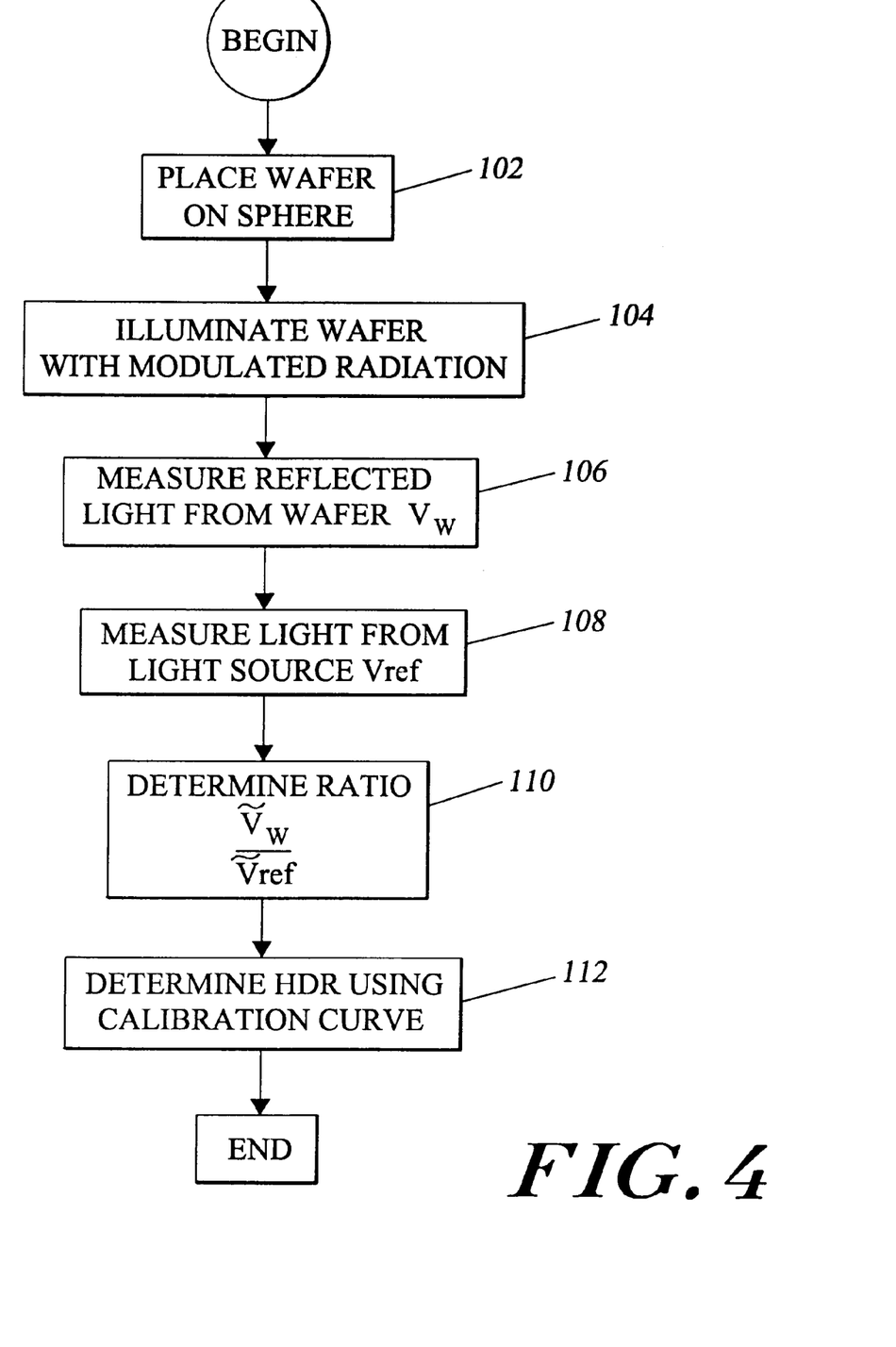
FIG. 4 is a schematic flow-chart diagram showing the measurement of the hemispherical directional reflectivity of the wafer in the illumination stage of the system of FIG. 2.
Figure 5:
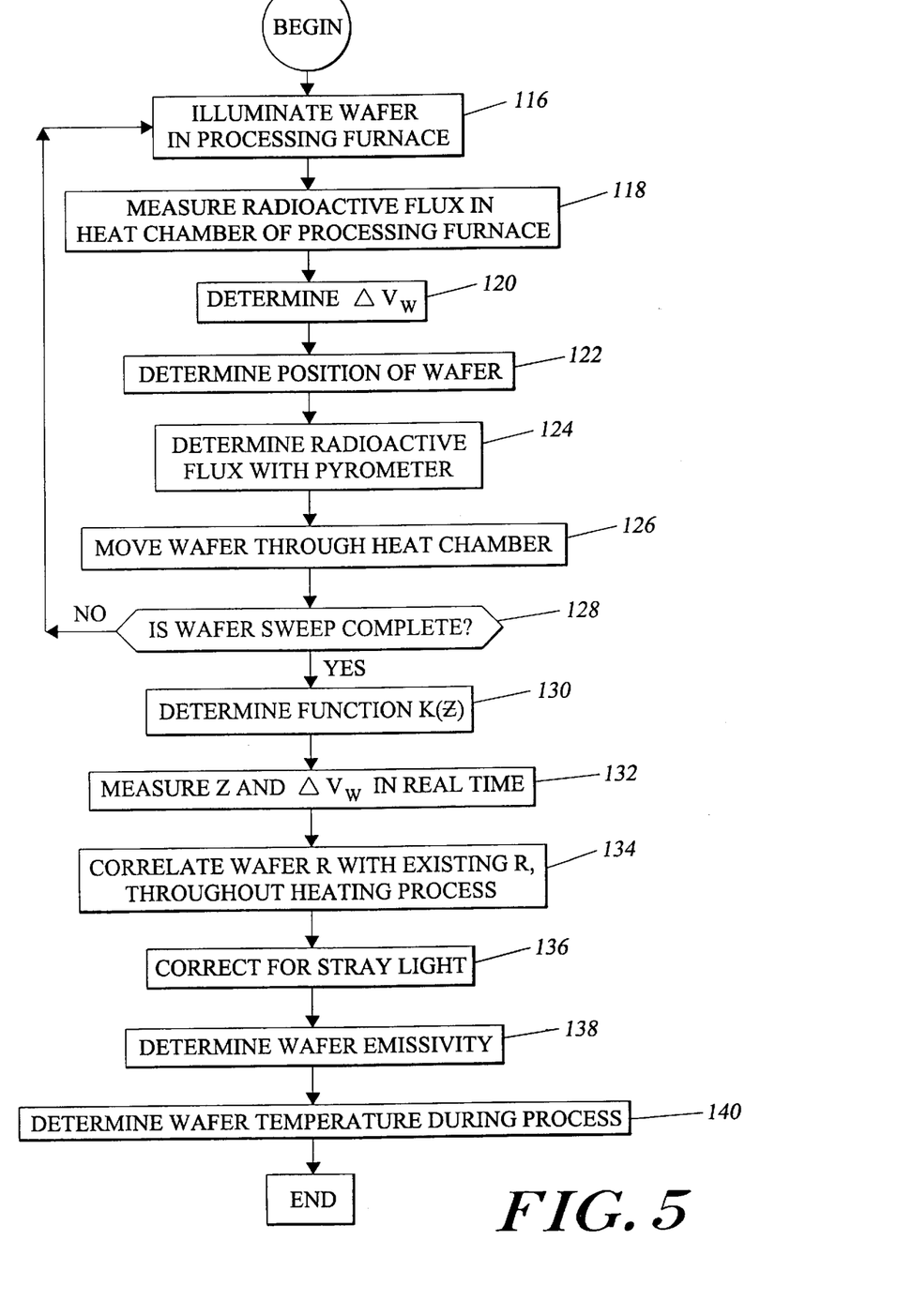
FIG. 5 is a schematic flow-chart diagram showing the measurement of the intensity of the radiation reflected from the wafer in the heating chamber of the system of FIG. 3, as well as the correlation of the ex situ wafer reflectivity with the in situ wafer reflectivity.

FIGS. 4 and 5 are schematic flow chart diagrams illustrating the operation of the emissivity measuring system 10 of the present invention. In operation, the control stage 50 instructs the wafer handler 19 to place a wafer in the illumination stage 18, as set forth in step 102. The light source 30 generates, and modulates if desired, the output radiation which impinges on the back side of the wafer 18. Specifically, the light source 30 introduces modulated radiation into the integrating sphere 62 to uniformly and hemispherically illuminate a portion of the wafer, as set forth in step 104. The radiation reflected from the wafer is collected by suitable optical structure, such as by the fiber optic cable 26, as set forth in step 106. The radiation generated and emitted by the light source 30 is also measured by the detector 40, as set forth in step 108. The detector 42 generates output signal $V_w$ along transmission line 64, and the detector 40 outputs a voltage signal $V_{ref}$ along transmission line 66, both lines of which communicate the voltage output signals to the control stage 50. The control stage 50 then determines the ratio $V_w/V_{ref}$ as set forth in step 110. As illustrated in step 112, the system 10 determines the hemispherical directional reflectivity of the wafer using a predetermined calibration curve, which is determined before the wafer is placed within the chamber, while the wafer is at the selected low temperature. The illustrated system 10 thus determines the ex situ hemispherical directional reflectivity of the wafer while disposed at a first selected temperature.

With reference to FIG. 5, the control stage 50 then transfers the wafer W from the illumination stage 15 to the processing stage 22. The wafer is loaded on a suitable vertical support assembly, and is disposed within the process chamber 74. The light source 31, through the light pipe 78 and the fiber optic cable 32, illuminates the wafer W as set forth in step 116. The radiation or radiative flux within the process chamber 74 is then measured by the detection stage 36, and specifically by the pyrometer 96 and by the photodetector 90. The signal generated by the photodetector is passed through a lock-in amplifier 98 to generate the output signal $\Delta V_w$. This is set forth in steps 118 and 120. Concomitantly, the illustrated system 10 determines the position of the wafer W within the process chamber 74, as set forth in step 122. Furthermore, the illustrated system 10 determines the radiative flux within the process chamber 74 with the pyrometer 96 as set forth in step 124. The system 10 then sweeps the wafer W vertically through the process chamber 74, step 126, while measuring the radiative flux and vertical position of the wafer. The system then determines if the wafer sweep is complete, step 128, and if it is not, the system 10 reverts to step 116 and starts the process anew. If the wafer sweep is complete, then the control stage 50 generates the function K(z) to determine the constant of proportionality K, and measures the wafer vertical position z and the detector output $\Delta V_w$ in real time throughout the heating process, in accord with steps 130 and 132. The system then correlates the intensity of radiation reflected from the wafer $\Delta V_w$ (e.g., the in situ wafer reflectivity) with the ex situ wafer reflectivity measured in the illumination stage 18 in accordance with Equation 4, step 134. As set forth in steps 136 through 140, the system 10 then determines the stray light component and corrects or compensates for this component when utilizing the output signal of the pyrometer 96, as described in further detail below. The system 10 determines the wafer emissivity according to Equation 1 and from this information determines the real-time wafer temperature during the heating process.

A common problem in pyrometry is the introduction of stray radiation or light into the pyrometer. The term stray light as used herein is intended to include radiation that is reflected from the wafer and which is produced from sources other than a workpiece, such as the target wafer. Although prior art systems have attempted to measure this light radiation component, it has generally not been done with sufficient accuracy to meet the emissivity requirements of modern thermal processing systems. A significant advantage of the present invention is that it accurately and in real time determines the stray light component received by the pyrometer, thereby enabling the system to accurately measure wafer emissivity.

As previously described in connection with FIGS. 1 to 3, the wafer is placed within the thermal processing chamber 74 of the thermal processing furnace. When the wafer is initially introduced into the process chamber 74, it is disposed at a selected low temperature such as at room temperature and the intensity of the radiation emitted from the wafer is deemed to be negligible. Therefore, the total radiation ($I_{tot}$) collected by the pyrometer is deemed to be the stray light component of the total radiation, and this is measured and recorded by the system 10. Specifically, the total radiative flux within the process chamber 74, and as measured by the pyrometer 96, consists of the radiative flux emitted from the wafer plus the radiative flux emitted from other sources which is incident upon and reflected from the wafer. Since the output signal or photodiode current of the pyrometer 96 is linearly proportional to the radiative flux received thereby, the radiative flux can be correlated to the output current signal of the pyrometer according to the following equation:

$$I_{tot} = I_w + I_{SL} \qquad (7)$$

where $I_w$ corresponds to the portion of the pyrometer output signal which relates to the radiation emitted by the wafer, and $I_{SL}$ corresponds to that portion of the pyrometer output signal that corresponds to radiation emitted from sources other than the wafer and which is reflected from the wafer. This portion of the signal can include radiation from the light source 30, other sources, as well as radiation present within the chamber 74 and not emitted by the wafer. Hence, once the total reflected radiation portion of the signal is determined (non-wafer emitted radiation), it is subtracted from the total radiative flux to yield an accurate measurement of the emitted radiative flux. With reference to FIG. 3, the fiber optic cable 34D transfers radiation to the photodetector 90 and the pyrometer 96. The illustrated pyrometer 96 measures a selected portion of the radiative flux, and outputs a signal $I_{tot}$ that is linearly proportional to the received radiative flux. The pyrometer measures the radiative flux in real time and communicates the output signal over a selected link to the construct control stage 50. When the wafer is placed within the process chamber 74, the system 10 sweeps the wafer through the chamber, as previously described, while the system measures the chamber radiation (e.g., the output current signal of the pyrometer) and the vertical position of the wafer. If the wafer is at the selected low temperature, such as room temperature, the emitted light is insignificant relative to the total chamber radiation, and hence the radiation incident upon the pyrometer consists only of the radiation reflected from the wafer, and does not include radiation emitted by the wafer. This optical information is then stored in the control stage 50, and subsequently used to compensate or correct for the stray light component of the total flux $\Delta V_w$ during processing.

The intensity of the radiation reflected from the wafer and manifested in the output signal of the pyrometer is proportional to the intensity of the incident radiation and the general reflectivity of the wafer backside. The present invention assumes that the intensity of the incident radiation at a particular wafer position does not vary significantly throughout the process. Since the thermal processing furnace employed by the present invention functions much like a constant heating source, which is generally required to determine the stray light component in accord with the present invention, the thermal gradient created within the process chamber 74 satisfies this requirement. During heat processing of the wafer within the processing stage 22, the magnitude of the reflected radiation can be set forth as:

$$I_{SL} = I_{SL,o} \frac{R(T)}{R_o} \qquad (8)$$

where $I_{SL,o}$ is the intensity of the stray radiation measured during the sweep. The intensity okf the radiation emitted by the eafer can be determined in accordance with Equations 7 and 8. The intensity of the radiation emitted by the wafer can now be expressed by:

$$I_w = I_{tot} - I_{SL,o}(z) \frac{R(T)}{R_o} \qquad (9)$$

where SL stands for stray light or radiation. From Equations 8 and 9, the system 10 determines the emitted radiation intensity of the wafer and thus the reflectivity of the wafer. Once the radiation received by the detection stage 36 is compensated for in terms of its stray light component, the measured hemispherical directional reflectivity is correlated by the control stage to wafer emissivity according to Equation 1, which in turn can be correlated according to known techniques to wafer temperature.

Figure 6:
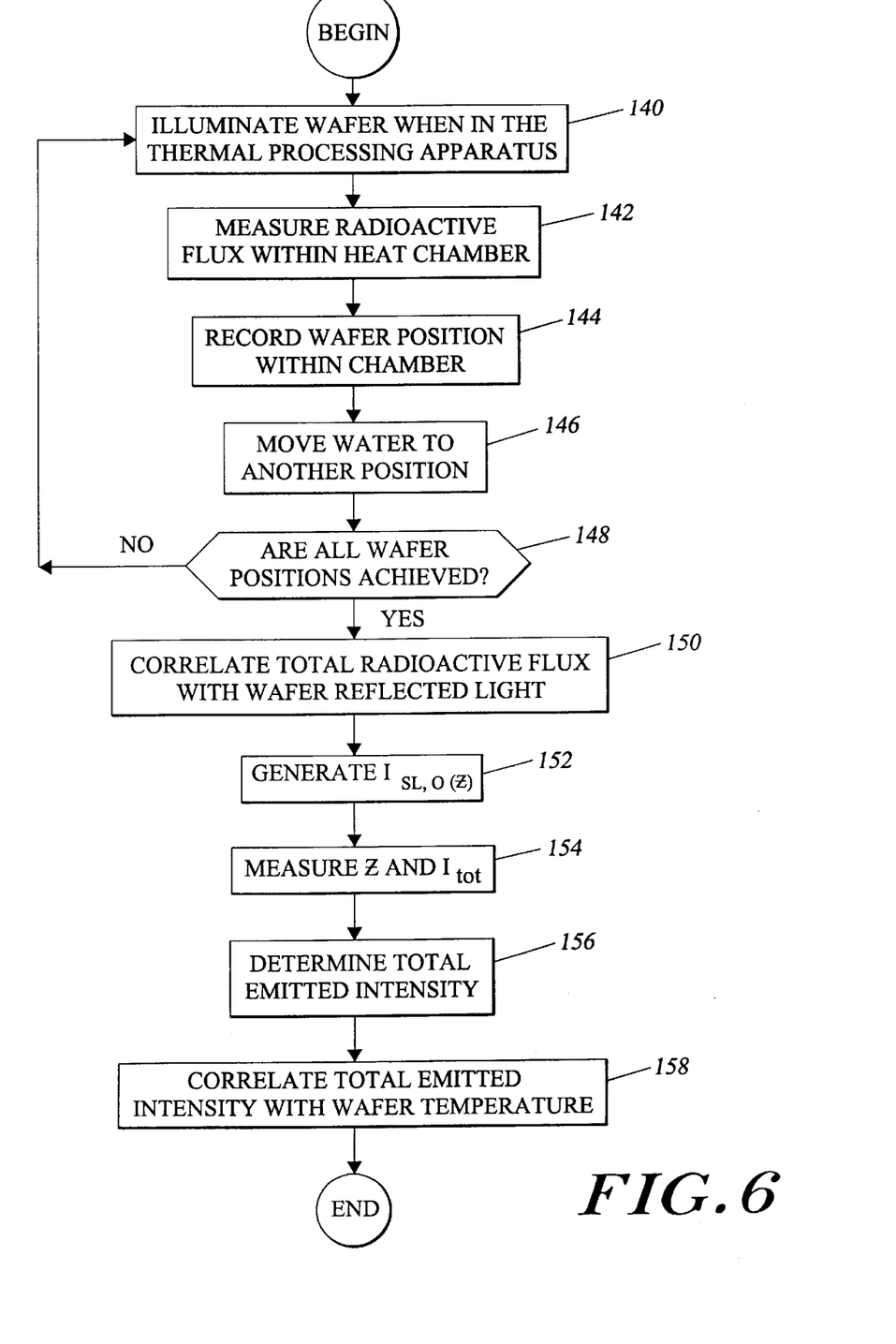
FIG. 6 is a schematic flow-chart diagram showing the determination of the stray light component of the total radiation within the heating chamber of the system of FIG. 1.

With reference to FIG. 6, the system 10 operates to determine the stray light component of the radiative flux within the process chamber 74 by illuminating the wafer when resident within the thermal processing apparatus, as set forth in step 140. The system 10 then transfers the radiative flux within the chamber to the pyrometer 96, which in turn generates an output signal (e.g., a photodiode current signal) indicative of the received radiative flux. This information is conveyed to the control stage 50 and is recorded. The system 10 also records the vertical position of the wafer within the chamber 74 and correlates this position with the radiative flux measured at that position by the pyrometer. Those of ordinary skill will readily recognize that the amount of radiation reflected from the wafer varies in accordance with the vertical position of the wafer in the chamber. This is set forth in steps 142 to 146.

The system 10 then determines whether the wafer sweep is complete, and if it is not, reverts to step 140 and again measures the radiative flux and the wafer position within the chamber. If the wafer sweep is complete, the system correlates the total radiative flux received by the pyrometer with the wafer reflected light, since the silicon wafer is assumed to have little or no radiative emittance at the selected low temperature. The system then determines $I_{SL,o}$ (z) and measures and records the wafer vertical position z and the pyrometer output signal $I_{tot}$, as set forth in steps 152 and 154. From the total radiative flux measurement and the forefoing values, the system 10 determines the total emitted intensity of the radiation within the process chamber 74. This is generally performed by the system during heat processing of the wafer. The system then employs this information, along with the reflectivity and emissivity measurements, to determine the wafer temperature in real time during processing. This is set forth in steps 156 to 158.

A significant advantage of the present invention is that it accurately determines and then compensates for the stray light component within the system 10 by assuming that the relative emittance of the wafer at the selected low temperature is negligible. Hence, the pyrometer output signal is equated with the stray light component of the system. The present system does not employ a quartz window, and thus does not provide components that are subject to unwanted chemical deposition. Furthermore, the illustrated system does not require the use of specially designed quartz or silicon tubes in order to accurately measure wafer emissivity.

Another significant advantage of the present invention is that it employs a correlation scheme that correlates ex situ wafer reflectivity with in situ wafer reflectivity in order to avoid having to achieve uniform hemispherical illumination of the wafer within the chamber 74. This provides for a highly accurate, real time emissivity measuring system that satisfies the emissivity measurement needs of modern thermal processing systems, and in particular, is capable of satisfying emissivity accuracy requirements of about +/−0.005.

The present invention also provides for a simple and elegant design for correlating the measured radiative flux within the chamber 74 with the radiation generated by sources other than the wafer. This is achieved by measuring the radiative flux within the process chamber 74 with the illustrated system components.

Figure 8:
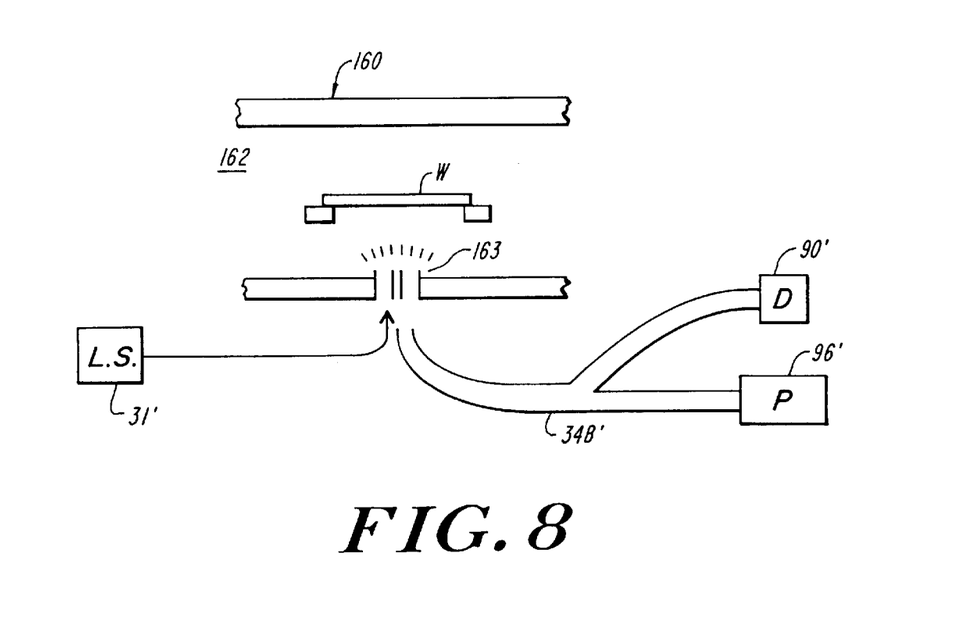
FIG. 8 illustrates a horizontal thermal processing apparatus suitable for use with the system of FIG. 1 in place of the vertical processing apparatus in accordance with the teachings of the present invention.

FIG. 8 illustrates an alternate embodiment of the emissivity measurement system 10 of the present invention which is independent of the position of the wafer within the process chamber of a thermal processing apparatus. Like numbers represents like parts plus a superscript prime. The processing stage 160 forms a process chamber 162 that mounts a wafer W on a selected mounting apparatus. If the chamber walls are heated at a constant temperature, then all of the foregoing emissivity and stray light measurement techniques can be employed in connection with this embodiment. In operation, radiation from a light source 31' is directed to the chamber 162 of the thermal processing furnace through a suitable radiation introducing aperture 163 in order to transmit radiation to a backside of the wafer W. The radiation reflected from the wafer and/or radiation resident within the chamber 162 is captured by the fiber optic cable 34B' and is directed to either the photodetector 90' or the pyrometer 96'. Since the thermal processing apparatus is disposed in a horizontal configuration, the reflectivity and temperature measurements performed on the wafer are independent of the vertical position within the chamber 74'. Hence, in accord with the previous teachings, the wafer is introduced into the chamber 74', the radiative flux is measured within the chamber according to the foregoing techniques. If the chamber is not maintained at a constant temeprature, for example, cycle on and off heat lamps, then only the foregoing emissivity measurement techniques can be employed in connection with this embodiment.

A significant advantage of this position independent design is that it does not require the monitoring and recording of a selected position, such as the vertical position of the wafer as illustrated on FIG. 3 during the measurement and wafer heating process. Moreover, According to yet another embodiment the system of FIG. 8 can be modified such that top and bottom hot plates can be provided to define the chamber and to heat the wafer to the suitable thermal processing temperatures. In this embodiment, the hot plates operate as a constant temperature heating source, and hence all of the foregoing emissivity and stray light measurement techniques can be employed. The foregoing embodiments are deemed to comprise part of the scope of the present invention.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A method for the real-time determination of emissivity of a semiconductor wafer during processing in a heating chamber of a thermal processing apparatus, said method comprising the steps of     determining the reflectivity of the wafer outside of the heating chamber of the thermal processing apparatus,     determining an intensity of radiation reflected from the wafer when disposed within the heating chamber of the thermal processing apparatus,     correlating the reflectivity of the wafer determined outside of the thermal processing apparatus with the intensity of the reflected radiation of the wafer determined within the heating chamber to determine the reflectivity of the wafer within the chamber, and     determining the emissivity of the wafer in real time, during processing, from the correlated wafer reflectivity determined within the thermal processing apparatus.

2. The method of claim 1, wherein the step of determining the reflectivity of the wafer outside of the heating chamber of the thermal processing apparatus comprises the step of measuring the hemispherical directional reflectivity of the wafer prior to thermal processing within the heating chamber of the thermal processing apparatus.

3. The method of claim 1, wherein the step of determining the reflectivity of the wafer outside of the thermal processing apparatus comprises the steps of     generally uniformly illuminating a portion of the wafer with radiation from a radiation source, and     measuring the intensity of the radiation reflected from the portion of the wafer.

4. The method of claim 3, wherein the step of determining the reflectivity of the wafer outside of the heating chamber outside of the heating chamber of the thermal processing apparatus further comprises the steps of     measuring the intensity of the radiation of the radiation source, and     determining the reflectivity of the wafer from said measured radiation intensity of the wafer and the radiation source.

5. The method of claim 1, wherein the step of determining the reflectivity of the wafer outside of the heating chamber of the thermal processing apparatus comprises the steps of     generally uniformly illuminating a portion of the wafer with radiation from a radiation source, and     determining a ratio of the intensity of radiation reflected from the portion of the wafer and the intensity of the radiation emitted by the radiation source.

6. The method of claim 5, wherein the step of determining the reflectivity of the wafer outside of the heating chamber further comprises the steps of     generating a calibration curve correlating the reflectivity of the wafer with said ratio, and     determining the reflectivity of the wafer from said calibration curve.

7. The method of claim 1, wherein the step of determining the reflectivity of the wafer outside of the heating chamber of the thermal processing apparatus comprises the steps of generally uniformly and hemispherically illuminating a portion of the wafer with radiation from a radiation source, and measuring the radiation reflected from the portion of the wafer.

8. The method of claim 1, further comprising the step of maintaining the temperature of the wafer during the step of determining the reflectivity of the wafer inside the heating chamber generally the same as the temperature of the wafer during the step of determining the reflectivity of the wafer outside of the heating chamber of the thermal processing apparatus.

9. The method of claim 1, wherein the step of determining the reflectivity of the wafer outside of the heating chamber of the thermal processing apparatus comprises the steps of generally uniformly illuminating a portion of the wafer with an integrating sphere with radiation from a radiation source, and collecting the radiation reflected from the wafer.

10. The method of claim 9, further comprising the steps of measuring the intensity of the radiation reflected by the wafer outside of the heating chamber, measuring the intensity of the radiation emitted from the radiation source, determining a selected mathematical relationship between the measured intensity of the reflected radiation and the radiation from the radiation source, generating a calibration curve correlating the reflectivity of the wafer with said mathematical relationship, and determining the reflectivity of the wafer from said calibration curve.

11. The method of claim 9, wherein said step of determining the reflectivity outside of the heating chamber of the thermal processing apparatus further comprises the step of modulating the radiation emitted by the radiation source.

12. The method of claim 1, wherein the step of determining the intensity of reflected radiation of the wafer within the heating chamber further comprises the steps of illuminating the wafer when disposed within the heating chamber with a radiation source, and measuring the intensity of the radiation reflected from the wafer within the chamber with a detector, said detector generating an output signal proportional to the intensity of the reflected radiation.

13. The method of claim 12, further comprising the step of generating a first output signal proportional to the intensity of the radiation reflected from the wafer in response to an output detection signal generated by a detector.

14. The method of claim 13, further comprising the steps of modulating the radiation emitted by the radiation source, and filtering the first output signal to remove frequencies other than the frequency of the modulated radiation.

15. The method of claim 12, further comprising the step of correlating the reflectivity of the wafer within the chamber with the intensity of the measured reflected radiation of the wafer within the chamber.

16. The method of claim 12, further comprising the step of determining the reflectivity of the wafer within the chamber by the following formula:

$$R = K \Delta V_w$$

where R is the reflectivity of the wafer within the heating chamber, K is a constant of proportionality, and $\Delta V_w$ is the intensity of the radiation reflected from the wafer within the chamber.

17. The method of claim 16, further comprising the step of determining the constant of proportionality K by sweeping the wafer through the heating chamber of the thermal processing apparatus, and determining the constant of proportionality K from the radiation reflected from the wafer during the sweep and the reflectivity of the wafer determined outside of the heating chamber.

18. The method of claim 17, further comprising the step of calculating the reflectivity of the wafer during processing from at least the constant of proportionality K, measuring the intensity of the radiation reflected from the wafer during processing, and determining the real time wafer reflectivity from the measured reflected radiation and the constant of proportionality.

19. The method of claim 18, wherein the step of determining the emissivity of the wafer in real time during processing comprises the step of determining the emissivity of the wafer from the real-time wafer reflectivity during processing.

20. The method of claim 12, further comprising the step of determining the reflectivity of the wafer as a function of the intensity of the reflected radiation measured within the chamber independent of the position of the wafer within the heating chamber.

21. The method of claim 12, further comprising the steps of moving the wafer through the heating chamber, measuring the intensity of the radiation reflected from the wafer within the chamber at one or more wafer positions, and storing the radiation intensity and associated position of the wafer during said measurement.

22. The method of claim 21, further comprising the step of measuring the intensity of the reflected radiation of the wafer without substantially heating the wafer from the temperature of the wafer when said reflectivity is determined outside of the thermal processing apparatus.

23. The method of claim 16, further comprising the steps of moving the wafer through the heating chamber, measuring the radiation intensity of the radiation reflected from the wafer within the chamber at one or more wafer positions, and calculating K to facilitate the determination of the reflectivity of the wafer during processing in the heating chamber.

24. The method of claim 1, further comprising the steps of illuminating the wafer when disposed within the heating chamber with a radiation source, and measuring the total radiation from the wafer when within the heating chamber with a detector as the wafer moves therethrough.

25. The method of claim 24, further comprising the step of correlating the measured total radiation from the wafer with radiation originating from sources other than the wafer.

26. The method of claim 1, further comprising the steps of illuminating the wafer when disposed within the heating chamber with a radiation source, measuring the total radiation from the wafer when within the heating chamber with a detector as the wafer moves therethrough without substantially heating the wafer from the temperature of the wafer when introduced to the heating chamber, and correlating the measured total radiation from the wafer with radiation originating from sources other than the wafer.

27. The method of claim 25, further comprising the step of determining radiation emitted from the wafer by subtracting said radiation originating from sources other than said wafer from said total measured radiation.

28. The method of claim 25, further comprising the step of determining the temperature of the wafer during processing from the wafer emissivity and from the radiation emitted from the wafer.

29. The method of claim 1, further comprising the step of determining the temperature of the wafer from at least the emissivity of the wafer.

30. A method for the real-time determination of emissivity of a semiconductor wafer during processing in a heating chamber of a thermal processing apparatus, said method comprising the steps of generally uniformly illuminating the wafer outside of said thermal processing apparatus, determining the reflectivity of the generally uniformly illuminated wafer, generally illuminating the wafer within the heating chamber of the thermal processing apparatus, determining the intensity of radiation reflected from the wafer within the heating chamber of the thermal processing apparatus, correlating the reflectivity of the wafer illuminated outside of the heating chamber with the intensity of the reflected radiation of the wafer determined in the heating chamber to determine the wafer reflectivity during processing, and determining the emissivity of the wafer in real time during processing from the wafer reflectivity.

31. A system for determining in real-time the emissivity of a semiconductor wafer during processing in a heating chamber of a thermal processing apparatus, said system comprising reflectivity determination means for determining the reflectivity of the wafer outside of the heating chamber of the thermal processing apparatus, intensity determination means for determining an intensity of radiation reflected from the wafer when disposed within the heating chamber of the thermal processing apparatus, correlation means for correlating the reflectivity of the wafer determined outside of the thermal processing apparatus with the intensity of the reflected radiation of the wafer determined within the heating chamber to determine the reflectivity of the wafer within the chamber, and emissivity determination means for determining the emissivity of the wafer in real time, during processing, from the correlated wafer reflectivity determined within the thermal processing apparatus.

32. The system of claim 31, wherein said reflectivity determination means comprises measurement means for measuring the hemispherical directional reflectivity of the wafer prior to thermal processing within the heating chamber of the thermal processing apparatus.

33. The system of claim 31, wherein said reflectivity determination means comprises a radiation source for generally uniformly illuminating a portion of the wafer with radiation from said radiation source, and measurement means for measuring the intensity of the radiation reflected from the portion of the wafer.

34. The system of claim 33, wherein said reflectivity determination means comprises source measurement means for measuring the intensity of the radiation of the radiation source, and second reflectivity determination means for determining the reflectivity of the wafer from said measured radiation intensity of the wafer and the radiation source.

35. The system of claim 31, wherein said reflectivity determination means comprises a radiation source for generally uniformly illuminating a portion of the wafer, and ratio determination means for determining a ratio of the intensity of radiation reflected from the portion of the wafer and the intensity of the radiation emitted by the radiation source.

36. The system of claim 35, wherein said reflectivity determination means comprises means for generating a calibration curve correlating the reflectivity of the wafer with said ratio determined by said ratio determination means, and second reflectivity determination means for determining the reflectivity of the wafer from said calibration curve.

37. The system of claim 31, wherein said reflectivity determination means comprises a radiation stage for generally uniformly and hemispherically illuminating a portion of the wafer with radiation, and measurement means for measuring the radiation reflected from the portion of the wafer.

38. The system of claim 31, wherein said reflectivity determination means comprises a radiation stage including a radiation source in optical communication with an integrating sphere for generally uniformly illuminating a portion of the wafer with radiation generated by said radiation source, and collection means for collecting the radiation reflected from the wafer.

39. The system of claim 38, further comprising first intensity measurement means for measuring the intensity of the radiation reflected by the wafer, second intensity measurement means for measuring the intensity of the radiation emitted from the radiation source, means for determining a selected mathematical relationship between the measured intensity of the reflected radiation and the radiation from the radiation source, generation means for generating a calibration curve correlating the reflectivity of the wafer with said mathematical relationship, and means for determining the reflectivity of the wafer from said calibration curve.

40. The system of claim 38, wherein said reflectivity determination means further comprises means for modulating the radiation emitted by the radiation source.

41. The system of claim 31, wherein said intensity determination means comprises a radiation source for illuminating the wafer when disposed within the heating chamber, and a detector in communication with said radiation source for measuring the intensity of the radiation reflected from the wafer within the chamber, said detector generating an output signal proportional to the intensity of the reflected radiation.

42. The system of claim 41, further comprising means for generating a first output signal proportional to the intensity of the radiation reflected from the wafer in response to said output signal of said detector.

43. The system of claim 42, further comprising
a modulator for modulating the radiation emitted by the radiation source, and
a filter for filtering the first output signal to remove frequencies other than the frequency of the modulated radiation.

44. The system of claim 41, further comprising correlation means for correlating the reflectivity of the wafer within the chamber with the intensity of the measured reflected radiation of the wafer within the chamber.

45. The system of claim 41, wherein said reflectivity determination means determines the reflectivity of the wafer within the chamber according to the following formula:

$$R = K \Delta V_w$$

where R is the reflectivity of the wafer within the heating chamber, K is a constant of proportionality, and $\Delta V_w$ is the intensity of the radiation reflected from the wafer within the chamber.

46. The system of claim 45, further comprising determination means for determining the constant of proportionality K, said determination means includes means for sweeping the wafer through the heating chamber of the thermal processing apparatus, wherein said constant of proportionality K is determined from the radiation reflected from the wafer during the sweep and the reflectivity of the wafer determined outside of the heating chamber from said reflectivity determination means.

47. The system of claim 46, further comprising
means for determining the reflectivity of the wafer during processing from at least the constant of proportionality K,
intensity measurement means for measuring the intensity of the radiation reflected from the wafer during processing, and
second reflectivity determination means for determining the real time wafer reflectivity from the measured reflected radiation and the constant of proportionality.

48. The system of claim 47, wherein said emissivity determination means determines the emissivity of the wafer from the real-time wafer reflectivity of said second reflectivity determination means during processing.

49. The system of claim 41, further comprising
means for moving the wafer through the heating chamber, and
a memory module for storing the radiation intensity and associated position of the wafer.

50. The system of claim 45, further comprising
means for moving the wafer through the heating chamber, and
means for calculating K to facilitate the determination of the reflectivity of the wafer during processing in the heating chamber.

51. The system of claim 31, further comprising
a radiation source for illuminating the wafer when disposed within the heating chamber, and
a detector for detecting the total radiation from the wafer when within the heating chamber as the wafer moves therethrough.

52. The system of claim 51, further comprising means for correlating the measured total radiation from the wafer with radiation originating from sources other than the wafer.

53. The system of claim 52, further comprising temperature determination means for determining the temperature of the wafer during processing from at least one of the wafer emissivity and from the radiation emitted from the wafer.

54. A system for the real-time determination of emissivity of a semiconductor wafer during processing in a heating chamber of a thermal processing apparatus, said system comprising
a radiation stage including a radiation source for generally uniformly illuminating the wafer outside of the heating chamber of the thermal processing apparatus,
means for determining the reflectivity of the generally uniformly illuminated wafer,
means for generally illuminating the wafer within the heating chamber of the thermal processing apparatus,
means for determining the intensity of radiation reflected from the wafer within the heating chamber of the thermal processing apparatus,
means for correlating the reflectivity of the wafer illuminated outside of the heating chamber with the intensity of the reflected radiation of the wafer determined in the heating chamber to determine the wafer reflectivity during processing, and
means for determining the emissivity of the wafer in real time during processing from the wafer reflectivity.

55. A system for the real-time determination of emissivity of a semiconductor wafer during processing in a heating chamber of a thermal processing apparatus, said system comprising
a radiation stage including a radiation source for generally uniformly illuminating the wafer outside of the heating chamber of the thermal processing apparatus,
a programmed processor for determining the reflectivity of the generally uniformly illuminated wafer,
a second radiation source for illuminating the wafer within the heating chamber of the thermal processing apparatus,
a detector for determining the intensity of radiation reflected from the wafer within the heating chamber of the thermal processing apparatus,
means for correlating the reflectivity of the wafer illuminated outside of the heating chamber with the intensity of the reflected radiation of the wafer determined in the heating chamber to determine the wafer reflectivity during processing, and
means for determining the emissivity of the wafer in real time during processing from the wafer reflectivity.

* * * * *